(12) United States Patent
Ohba

(10) Patent No.: US 6,174,418 B1
(45) Date of Patent: Jan. 16, 2001

(54) CONTINUOUS PLATING APPARATUS

(76) Inventor: Kazuo Ohba, 2-3, Matsubacho 4-chome, Higashimatsuyama-shi, Saitama (JP)

( * ) Notice: Under 35 U.S.C. 154(b), the term of this patent shall be extended for 0 days.

(21) Appl. No.: 09/209,361

(22) Filed: Dec. 11, 1998

(30) Foreign Application Priority Data

| Jun. 11, 1998 | (JP) | ................................................. | 10-163610 |
| Jun. 16, 1998 | (JP) | ................................................. | 10-168415 |
| Jun. 18, 1998 | (JP) | ................................................. | 10-171422 |
| Jul. 2, 1998  | (JP) | ................................................. | 10-187413 |

(51) Int. Cl.$^7$ .................................................. C25D 17/00
(52) U.S. Cl. .......................................... 204/198; 204/227
(58) Field of Search .................................. 204/198, 227; 118/423, 424, 428, 429

(56) References Cited

U.S. PATENT DOCUMENTS

| 5,226,964 | * | 7/1993 | Meuche ................................. | 118/424 |
| 5,529,625 | * | 6/1996 | Knudsen ........................... | 118/429 X |
| 5,772,765 | * | 6/1998 | Hosten .............................. | 118/423 X |
| 5,827,410 | * | 10/1998 | Hosten ................................. | 204/198 |

FOREIGN PATENT DOCUMENTS 10-273799   10/1998   (JP) .

* cited by examiner

*Primary Examiner*—Donald R. Valentine
(74) *Attorney, Agent, or Firm*—Flynn, Thiel, Boutell & Tanis, P.C.

(57) ABSTRACT

A continuous plating apparatus in which a planar article, to be plated, laid vertically on a rail is delivered while being clamped on both sides by vertical rotational rollers including a drive roller, and continuously fed through a slit provided liquid-tightly in a plating bath wall into a plating bath, and after the plating, fed out of the bath through a slit provided liquid-tightly in the plating bath wall in the same way, meets the following requirements:

i) an upper end of the drive roller is arranged to be slanted forwardly and the slant of the drive roller is in the range of 1 to 10° so as to prevent the article to be plated from stepping during delivering;

ii) a part of an rotational roller and/or a drive roller is an electric feeding roller, and a means for peeling a plated layer adhered to the surface of the electric feeding roller is provided;

iii) a means for depressing the electric feeding roller against the article to be plated is provided for always keeping constant the flow of the current;

iv) adjacent positions of feeding rollers and drive rollers in a feeding direction are shifted up and down from the upstream roller position, thereby making the plated surface uniform; and v) the rail within the plating bath is divided into a suitable length, and elevated and lowered together with rotatable shafts to which ones of rotational rollers and drive rollers provided on both sides of the rail are fixed.

6 Claims, 8 Drawing Sheets

CONTINUOUS PLATING APPARATUS

BACKGROUND OF THE INVENTION

1. Field of the Invention

The present invention relates to an automatic plating apparatus for continuously plating a planar article such as a printed circuit board.

2. Description of the Related Art

Conventionally, in order to effect plating onto a plurality of planar articles, the articles are mounted one by one to a frame member connected to a cathode by a fastener. The articles are removed one by one after the completion of plating. This method is time-consuming, which leads to the reduction in efficiency of the plating work.

Therefore, recently, to avoid the fastening work of the articles to the frame member, a method is proposed in which the articles are continuously and individually fed into a plating bath one by one, and are shifted in the horizontal direction in the plating bath to thereby continuously perform the plating work with a high efficiency.

However, the articles to be plated have a variety of sizes. In order to uniformly plate any one of the variety of articles, it is necessary to finely adjust the plating conditions such as an arrangement of electrodes, an adjustment of a plating liquid surface, a current density and the like. This becomes a very difficult problem.

Accordingly, the present inventors try to stand the planar articles in a vertical direction in advance, continuously feed the articles to the plating bath through slits formed liquid-tightly on the wall of the plating liquid bath to perform the continuous plating work and to discharge the articles through the slits formed liquid-tightly on the opposite side in order to solve the above-noted defect.

In order to deliver the planar articles in the vertical direction within the plating liquid bath, as shown in FIG. 10, a lower edge of each planar article 3 held in the vertical position is laid on a rail 2 having a V-shaped cross-section extending in a vertical direction to the paper in a central bottom portion of the plating liquid bath 1. The article 3 is moved by drive rollers 4' while both surfaces thereof are being clamped by a plurality of vertical rotational rollers shown typically at 4 including the drive rollers 4'. Incidentally, in FIG. 10, reference numeral 5 denotes an anode, numeral 6 denotes a shield plate for preventing the turbulence of the current, and numeral 7 denotes a cylinder for moving the electrode 5 up and down. FIG. 11 is a side elevational view mainly showing a part of the rotational rollers 4. Out of the plurality of rotational rollers 4, for example, a central roller thereof is forcibly rotated as the drive roller 4' so that the planar articles 3 are delivered within the plating liquid bath in order to be plated by utilizing its frictional force.

However, the number of kinds of the planar articles which is represented by the printed circuit board is large, and the sizes are different from each other. Accordingly, in the case where the articles are held in the vertical direction, the heights thereof are different from each other. Accordingly, even if the movement of the drive rollers 4' and the rotational rollers 4 are pursuant to the most standard heights, in some cases, the feed of the articles may not be performed smoothly relative to the articles having the different heights. Also, it is necessary to cause the current as the cathode to flow between the cathode of the articles and the anode within the plating liquid bath, if the contact is not well performed, the plating is worse. Furthermore, the factor of the automatic continuous plating apparatus is to readily perform the maintenance or repair.

SUMMARY OF THE INVENTION

According to the present invention, in a continuous plating apparatus in which a planar article, to be plated, laid vertically on a rail provided within the plating liquid bath is delivered while being clamped on both sides by vertical rotating rollers including a drive roller disposed on both sides along the rail, it is characterized in that an upper end of the drive roller is arranged to be slanted forwardly. It is preferable that the slant of the drive roller is in the range of 1 to 10°.

The planar article to be plated is connected to a cathode. A part of the above-described rotational rollers and drive rollers is an electric feeding roller. The cathode is formed by the contact between the electric feeding roller and the article to be plated. The current is allowed to flow between the cathode and an anode within the plating bath so as to perform plating work on the surface of the article. In this case, in order to make better the contact between the electric feeding roller and the article to be plated, it is preferable that a pressure in a direction to depress the electric feeding roller to the article to be plated clamping surfaces is supplied to the electric feeding roller. Also, the surface of the electric feeding roller is made of film material that is harder than the subject plated film. In addition, a means for peeling the plated layer adhered to the electric feeding roller surface is brought into contact with the surface of the electric feeding roller. An unnecessary plate is scraped out of the surface of the electric feeding roller. Thus, the adverse affect of the plated surface of the article to be plated is obviated. The shape of the rotational rollers or the drive rollers may be a single cylindrical shape. However, it is possible to take a discontinuous cylindrical shape or a discontinuous flat tablet shape. The positions of the roller elements in each roller are shifted in the adjacent rollers whereby it is possible to broaden the surface area of the planar article when the latter is plated. Thus, it is possible to obtain a more stable plated film.

In the automatic plating apparatus, a single long rail is mounted over a full length of the plating bath. On both sides of the rail, a number of shafts that may be rotatable and extend vertically with feeding rollers fixed thereto are provided. In addition, these feeding rollers and the shafts are disposed in the plating liquid. Accordingly, it is difficult to perform the maintenance work therefor. In case of breakdown of these components, it is necessary to remove the plating liquid from the plating bath for the maintenance work and to again fill the plating liquid into the plating bath after the completion of the maintenance work. Thus, there is a problem that it takes a long time to perform the maintenance or repair work.

Therefore, according to the present invention, the rail within the plating bath is provided by dividing into a suitable length, and rotatable shafts to which feeding rollers including the drive rollers provided on both sides of the divided rails are fixed may be elevated and lowered together with the divided rails. Thus, the above-described problem is solved. Then, in order to avoid the scratch of the article to be plated; each divided rail has a convexly curved upper edge, which contacts first with the planar article being conveyed. Thus, it is possible to obviate the fear that the article to be plated to be delivered is scratched and stepped at the convexly curved upper edge of the forward divided rail of the joints between the divided rails. This is available for the smooth delivery as well as with the slant of the drive rollers. Also, the joints of the divided rails are stepped up and down so that the adjacent divided rails support each other to eliminate the steps in the delivery direction.

DETAILED DESCRIPTION OF THE PREFERRED EMBODIMENTS

The present invention will now be described in detail with reference to the accompanying drawings.

Figure 1:
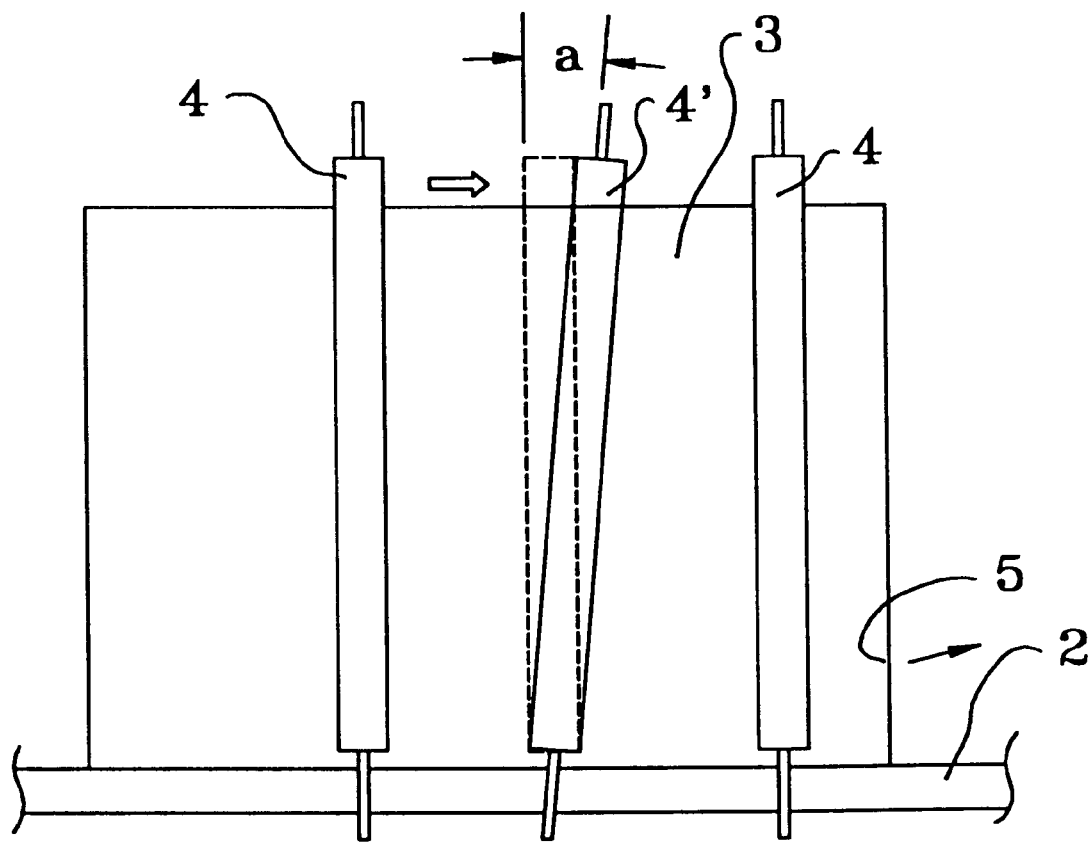
FIG. 1 is an illustration of an example of a slanted drive roller.
Figure 11:
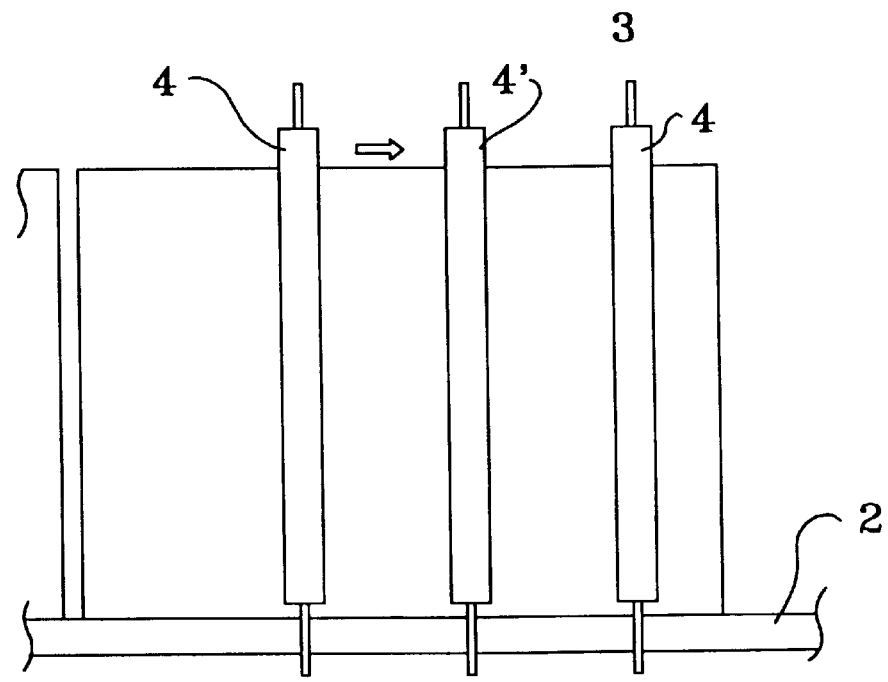
FIG. 11 is an illustration of the feed of the article to be plated.

The system shown in FIG. 1 is the same as the above-described prior art shown in FIG. 11 in the point that the planar article 3 to be plated is delivered with both surfaces thereof being clamped by the vertical rollers shown typically at 4 including the drive roller 4' on the rail 2 having the V-shaped cross section. However, in the embodiment shown in FIG. 1, the drive roller 4' is arranged so that its upper end portion is slanted forwardly at an angle a from a normal position indicated by the dotted lines. Thus, the lower end of the planar article 3 to be plated is brought into contact with the drive roller 4 earlier than the upper end thereof so that the force directed upwardly as indicated by the arrow is applied to the front lower end portion 5. For this reason, even if the scratch force directed downwardly is applied to the front lower end portion 5, the force is canceled by the above-described upwardly directed force, thereby attaining the smooth delivery at any time. The number of the drive rollers 4' may be changed as desired in accordance with a size and a length of the apparatus.

Figure 2:
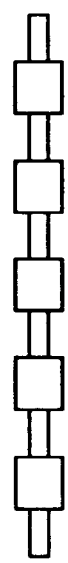
FIG. 2 is an illustration of an example of another vertical roller (drive roller)
Figure 3:
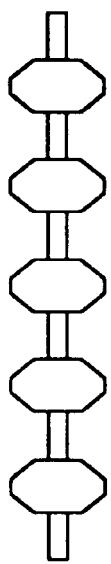
FIG. 3 is an illustration of an example of another vertical roller (drive roller)
Figure 4:
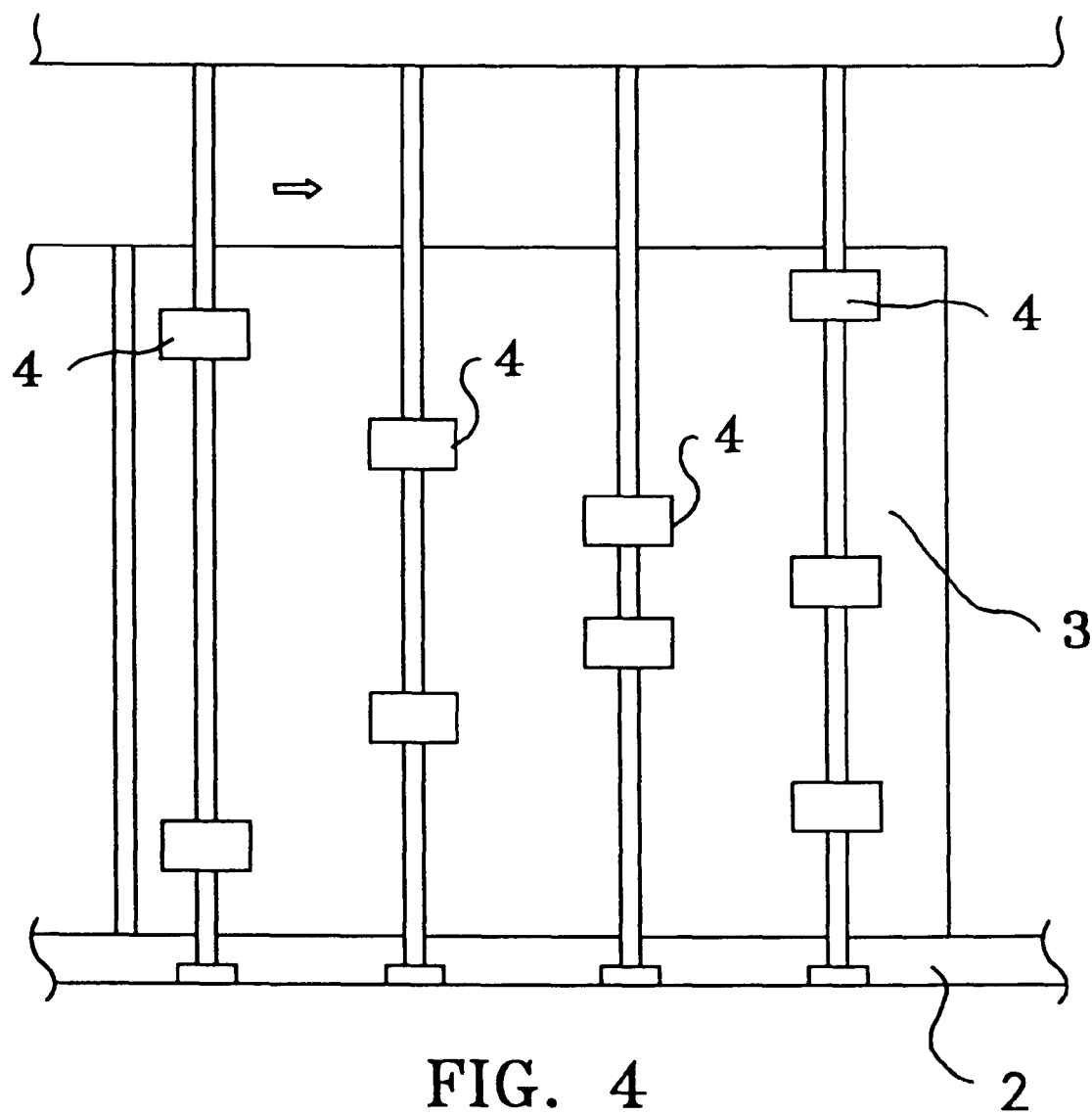
FIG. 4 is an illustration of an example in which roller elements are shifted in the adjacent vertical rollers (drive rollers)

Also, the shapes of the drive rollers 4' and the vertical rollers 4 may be formed into discontinuous cylinders as shown in FIG. 2 or discontinuous flat tablet shapes as shown in FIG. 3. Then, in such a divided-type roller system, the positions of adjacent roller elements of the respective rollers are shifted to each other as shown in FIG. 4 so that the plated surface of the planar article to be plated 3 to be covered by the rollers may be reduced at minimum for the stable plated film formation.

Figure 5:
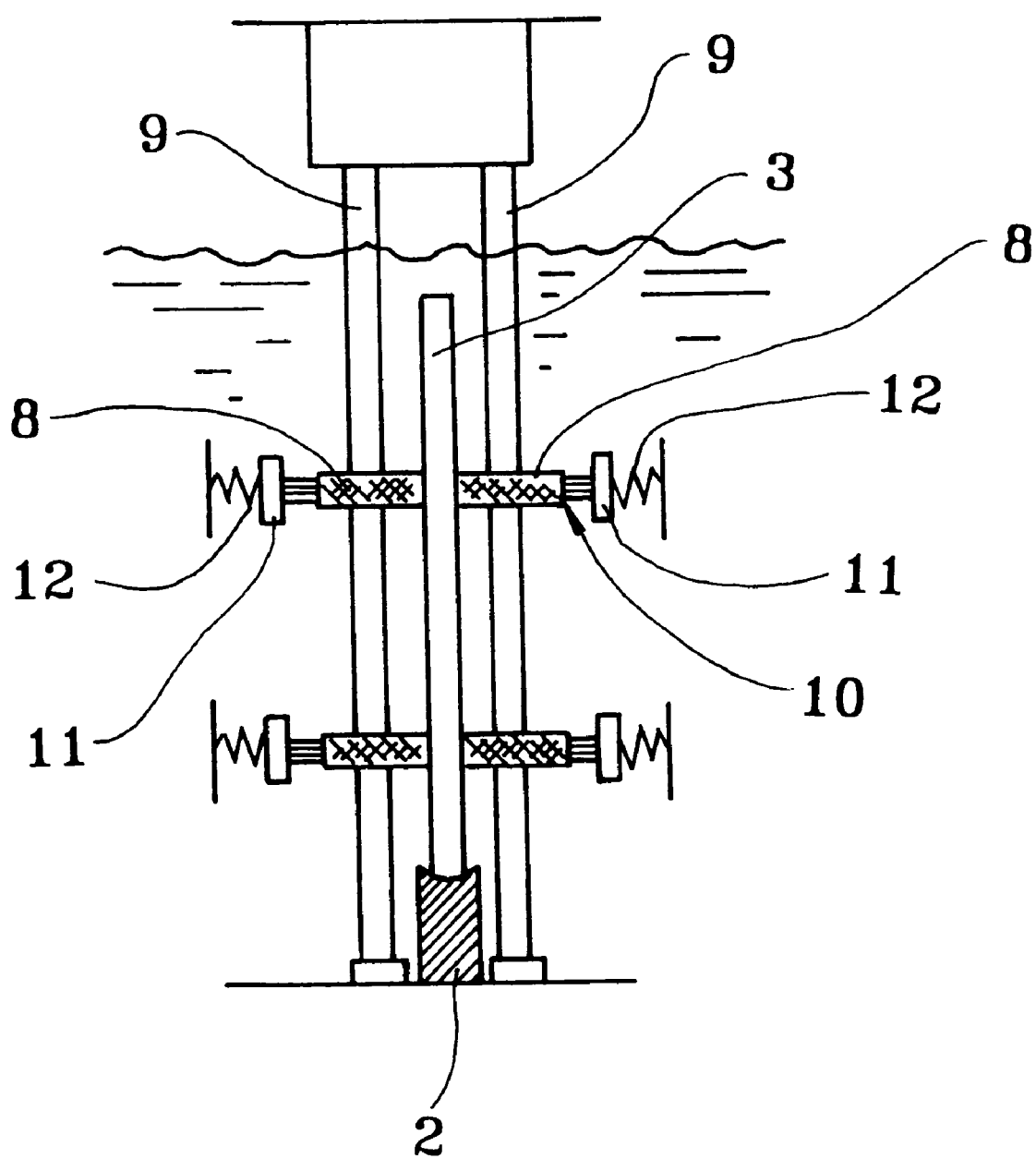
FIG. 5 is an illustration of an example of an electric feeding roller.

FIG. 5 shows an example in which parts of the vertical rollers or the drive rollers serve as electric feeding rollers 8 which are provided in a rotary cathode rod 9. A protection film 10 made of film material, for example, a nickel phosphoric alloy, that is harder than the subject plating film such as a copper film, in which a titanium nitride is formed thereon is formed on the contact surface of the electric feeding rollers 8 with the article to be plated 3. Reference numeral 11 denotes brushes which are depressed by springs 12 at suitable position of the contact surface with the electric feeding rollers 8. As the electric feeding rollers 8 rotate, plating adhesives generated in the contact surface are removed. The protection film 10 which is harder than the plated layer is formed on the contact surface of the electric feeding rollers 8. Accordingly, the protection film 10 is not damaged and the plating adhesives may readily be removed. It is more preferable that the mounting position of the brushes 11 be a position where the electric feeding rollers 8 rotate immediately before contacting with the article to be plated 3. Also, it is possible to use any other suitable removing means such as blades instead of the brushes. Thus, the plated film may be formed uniformly without a fear that the plated layer formed on the surface of the article to be plated 3 is damaged by an unnecessary plated film adhered to the electric feeding rollers 8.

Such an electric feeding roller system is effective for a variety of kinds of planar articles to be plated which are different in size from each other. However, the contact force of the electric feeding rollers 8 with the planar article to be plated 3 is changed in response to a small or large thickness of the sheet. In some cases, there is a fear that a conductive failure is generated to damage the uniform plating.

Figure 6:
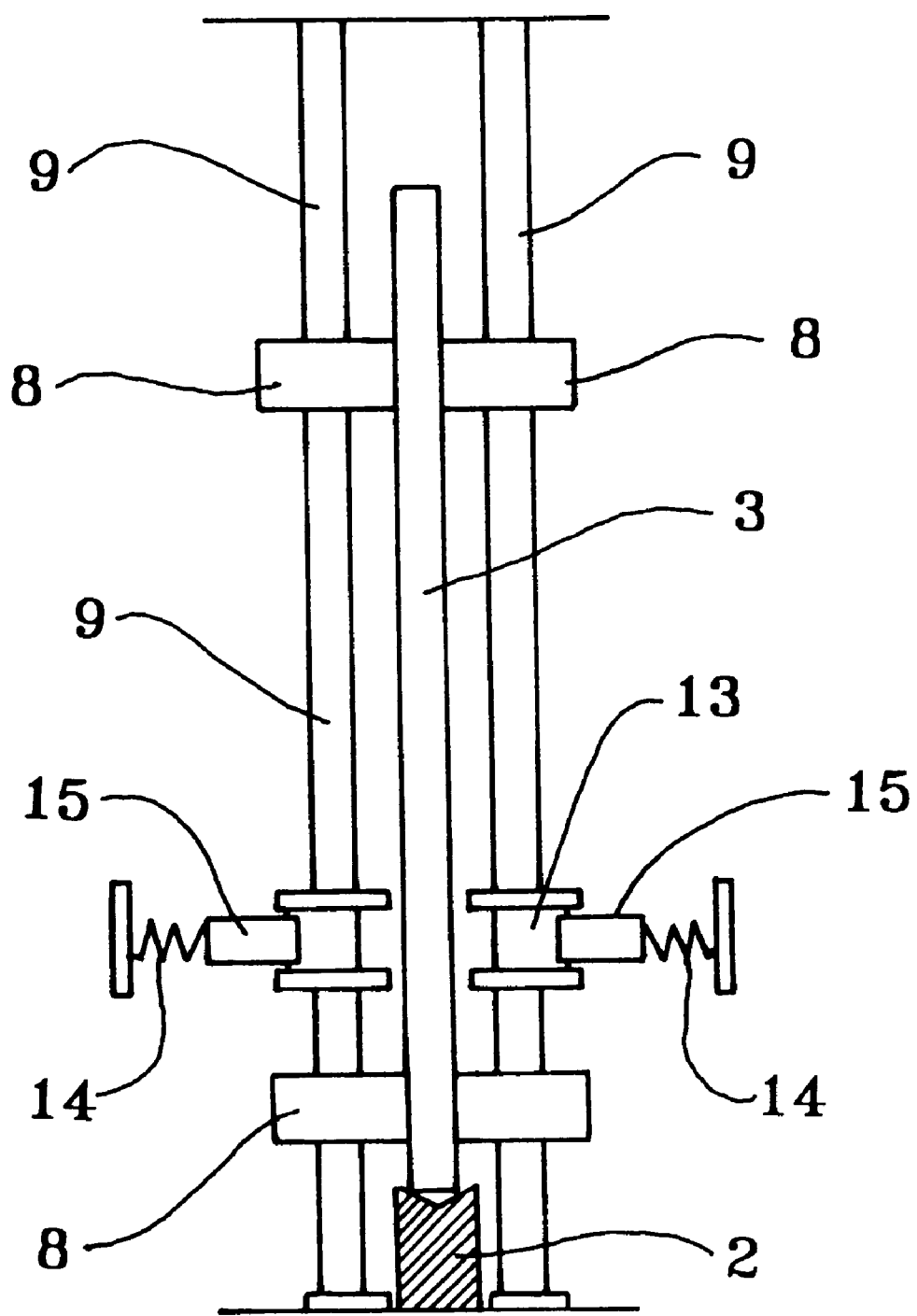
FIG. 6 is an illustration of an example in which the electric feeding roller is depressed against the article to be plated.

FIG. 6 shows an example of a countermeasure therefor. A wheel 13 is provided at a suitable position of the rotary cathode rod 9. A pressure member 15 in contact with the wheel 13 for exhibiting the depression effect by a spring 14 depresses the wheel 13 toward the article to be plated 3. This pressure is transmitted to the electric feeding roller 8 so that the contact between the electric feeding roller 8 and the article to be plated 3 is ensured and the flow of current to the surface of the article to be plated 3 may become uniform. Accordingly, the plated film formed on the surface of the article to be plated 3 becomes uniform. The position where the pressure member 15 is provided may be changed or the number of the pressure members 15 may be increased in response to a size of the apparatus or the like.

Figure 7:
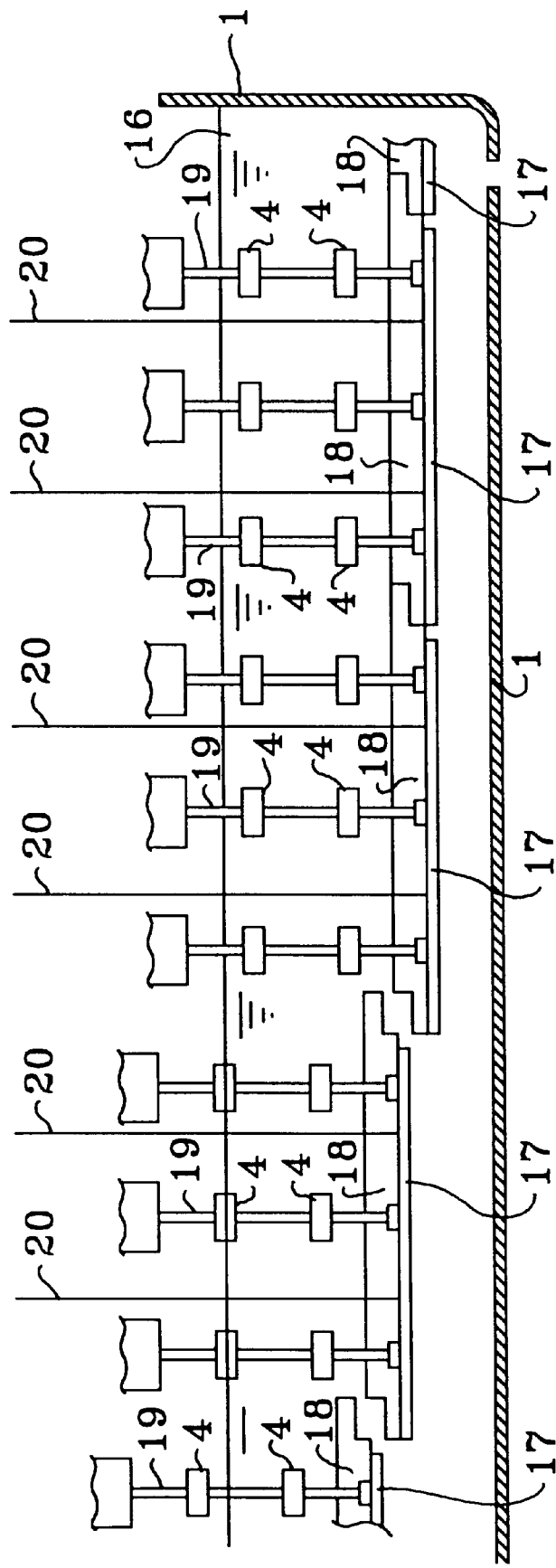
FIG. 7 is an illustration of an example using divided rails.

FIG. 7 shows an example of divided rails. A plating liquid 16 is filled in a plating bath 1 elongated in the horizontal direction of FIG. 7. The divided rails shown typically at 18 which are divided in a suitable length in the longitudinal direction are provided in series with each other together with support bases 17, 17, . . . over the full length of the plating bath 1 in the vicinity of the bottom of the plating bath 1. As viewed from above, the divided rails shown typically at 18 re arranged in a linear manner. On both sides thereof, vertical rollers 4 (and/or drive rollers 4') fixed to shafts 19 that extend vertically to be rotatable are provided on the support bases shown typically at 17 at intervals in the longitudinal direction of the divided rails 18 and are connected to the cathode in a suitable manner as described above.

Figure 8:
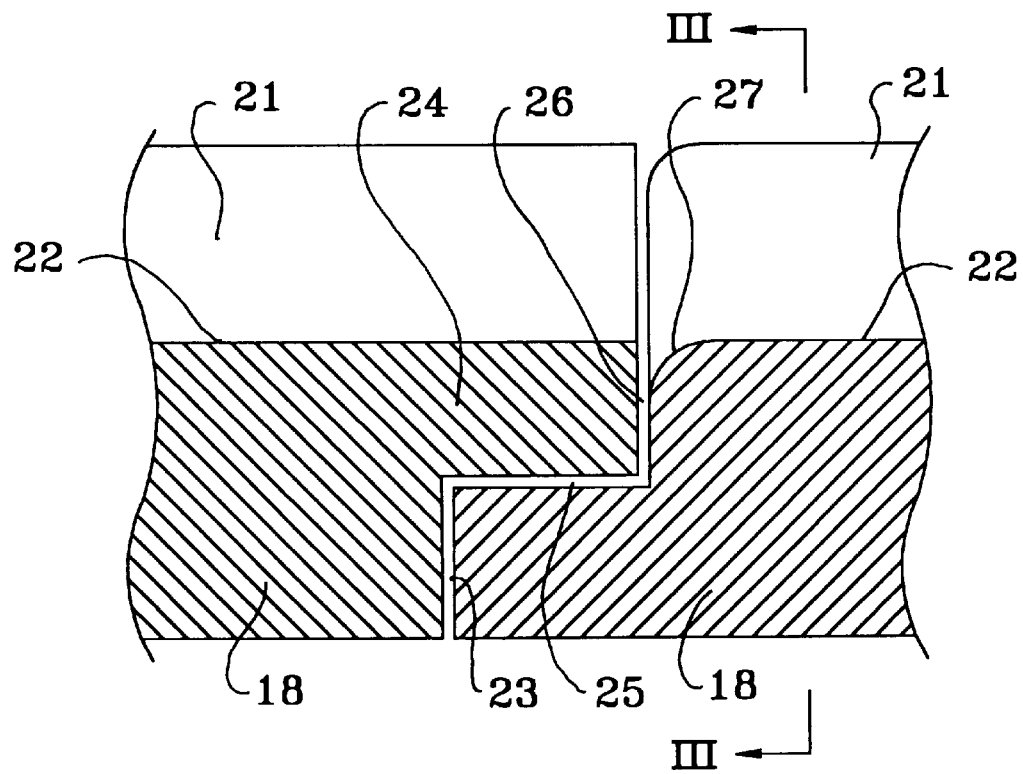
FIG. 8 is an enlarged cross-sectional view showing an example of a joint of the divided rails taken along the line II—II.
Figure 9:
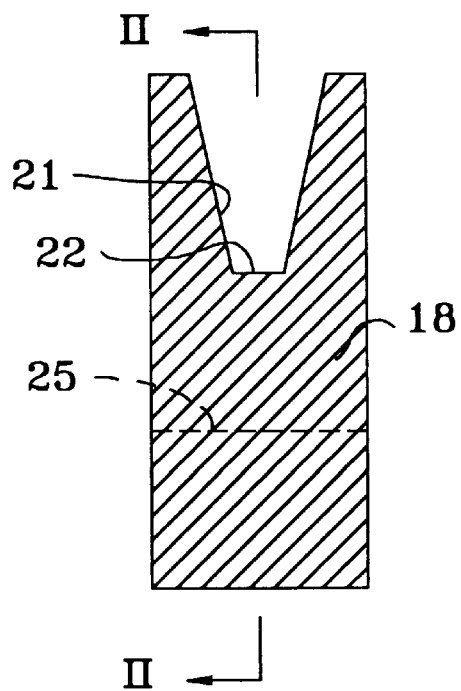
FIG. 9 is a cross-sectional view of the divided rails taken along the line III—III.
Figure 10:
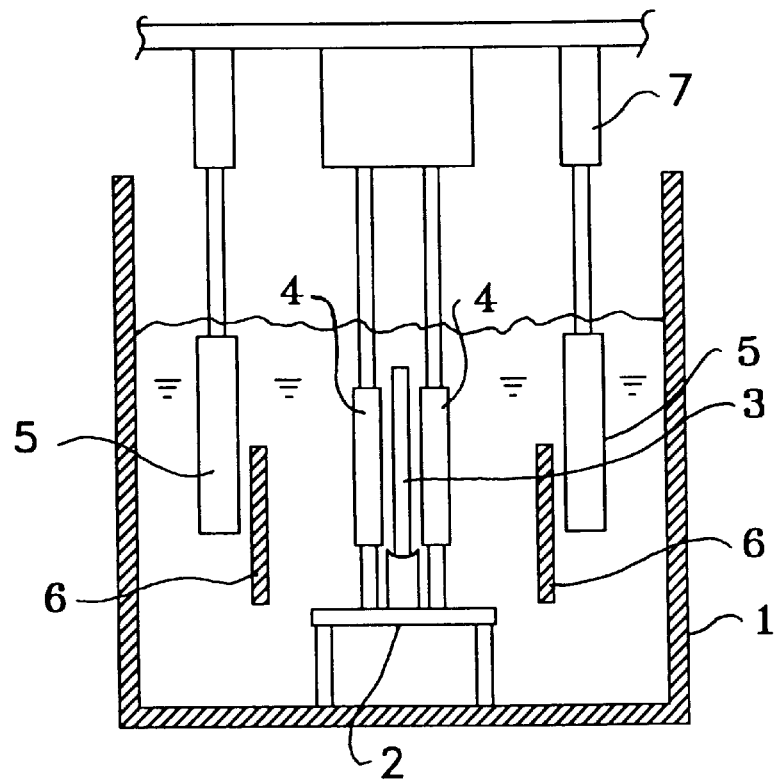
FIG. 10 is a cross-sectional view of a continuous plating apparatus.

An elevating device 20 such as a suspension wire is mounted on respective support bases 17, 17 . . . so that the support bases 17, 17 . . . may be lifted or lowered together with the shafts shown typically at 19 provided on both sides of respective divided rails 18. FIGS. 8 and 9 show an example of respective divided rails 18. FIG. 8 is an enlarged cross-sectional side elevational view as viewed from the line II—II of FIG. 9. FIG. 9 is a longitudinal frontal view as viewed from the line III—III of FIG. 8. As shown in FIG. 9, a V-shaped groove 21 is formed at an upper center of the divided rail 18 as well as in the rail 2 shown in FIG. 10.

As shown in FIG. 8, a horizontally recessed portion 23 is formed at the right end below a bottom surface 22 of the V-shaped groove 21 of respective divided rails 18. The portion above the recessed portion 23 is formed into a projection 24 projecting horizontally. A projecting portion 25 which may be engaged with the recessed portion 23 is formed at the left end below the bottom surface 22 of the V-shaped groove 21 of respective divided rails 18. The portion above the projecting portion 25 is formed into a recessed portion 26 that may be intimately engaged with the above-described projection 24. Furthermore, the left end portion of the bottom surface 22 of the V-shaped groove 21 of respective divided rails 18 is formed into a convexly curved upper edge.

When the adjacent divided rails 18 are lowered together, as shown in FIG. 8, the projecting portion 25 of the right divided rail 18 is intimately engaged with the recessed portion 23 of the left divided rail 18, and the projection 24 of the left divided rail 18 is intimately engaged with the recessed portion 26 of the right divided rail 18 so that the bottom surfaces 22 of the respective V-shaped grooves 21 are flush with each other in the same level surface.

It is understood that the provision of the recessed portions and the projecting portions in the right and left portions of the divided rails 18 is just an example and it is possible to abut the vertical end faces with each other.

When all the divided rails 18 shown in FIG. 7 are lowered, the article to be plated (not shown) is laid on the V-shaped groove 21 of the divided rail 18 located on the leftmost side within the plating bath 1, and under the condition that the article is dipped in the plating liquid 16 and both the surfaces thereof are clamped by the vertical rollers 4 or the like, the article is moved from the left side to the right side within the plating bath 1 by the rotation of the drive rollers 4'. In the meantime, current is caused to flow between the anode 5 shown in FIG. 10 and the electric feeding rollers which are partially replaced for plating.

As shown in FIG. 8, since the left end of the bottom surface 22 of the V-shaped groove 21 of the divided rails 18 is formed into the convexly curved upper edge 27, even if the level of the bottom surface 22 of the right V-shaped groove 21 is somewhat higher in the joint portion of the divided rails 18, the article to be plated is guided by the convexly curved upper edge 27 so as to move smoothly without any scratch when the article to be plated is shifted from the left divided rail 18 to the right divided rail 18.

When maintenance or repair is effected to the divided rails 18, the drive rollers 4', the shafts 19 and the like, the divided rails 18 or the shafts 19 are elevated for each divided rail by utilizing the elevating device 20 in order from the left side of FIG. 7 and picked up out of the plating bath 1 for the maintenance or repair. If the work is finished and the divided parts are lowered to the original position, it is possible to again perform the plating work. If the joints of the respective divided rails are not stepped but in abutment with each other as in the embodiment, it is sufficient to elevate the part that needs the maintenance or repair. Various details of the invention may be changed without departing from its spirit nor its scope. Furthermore, the foregoing description of the embodiments according to the present invention is provided for the purpose of illustration only, and not for the purpose of limiting the invention as defined by the appended claims and their equivalents.

What is claimed is:

1. A continuous plating apparatus for plating a planar article comprising:
    a plating bath compartment having a first wall and a second wall;
    a slit sized to receive the planar article into the plating bath compartment, said slit being provided liquid-tightly in the first wall;
    a rail having a V-shaped cross-section sized to support the planar article thereon in the plating bath compartment, said rail having two opposing sides;
    a plurality of rotational rollers and a plurality of drive rollers, said plurality of rotational rollers and said plurality of drive rollers being positioned vertically and disposed on both sides along said rail, wherein an upper end of each of said plurality of drive rollers is positioned to be slanted forward of a bottom end and adjacent positions of said plurality of rotational rollers and said plurality of drive rollers are mutually shifted up and down;
    an anode in the plating bath compartment;
    a shield plate in the plating bath compartment;
    a cylinder in operative communication with the anode; and
    a slit in the second wall placed to allow the planar article to exit from the plating bath compartment in the second wall, said slit being provided in the second wall liquid-tightly.

2. The continuous plating apparatus according to claim 1, wherein the upper end of each of said plurality of drive rollers is positioned to be slanted forwardly in the range of 1 to 10°.

3. A continuous plating apparatus for plating a planar article comprising:
    a plating bath compartment having a first wall and a second wall;
    a slit provided liquid-tightly in the first plating bath compartment wall;
    a rail having V-shaped cross-section;
    a cathode;
    a plurality of rotational rollers and a plurality of drive rollers, said plurality of rotational rollers and said plurality of drive rollers being positioned vertically and disposed on opposite sides of said rail, wherein a part of each of the plurality of rotational rollers and the plurality of drive rollers forms a surface of an electric feeding roller, the electric feeding roller in contact with the planar article allowing current to flow from the cathode, and the surface of the electric feeding roller being formed of a film material that is harder than a subject plated film;
    means for peeling a plated layer adhered to the surface of the electric feeding roller, said means being brought into contact with the surface of the electric feeding roller;
    an anode in the plating bath compartment;
    a shield plate in the plating bath compartment;
    a cylinder in operative communication with the anode; and
    a slit provided in the second wall liquid-tightly positioned to send out the planar article.

4. The continuous plating apparatus according to claim 3, comprising a pressure means for pressing said electric feeding roller against the planar article to be plated.

5. The continuous plating apparatus according to claim 4, wherein said pressure means includes a pressure member which is slidably provided on a wheel provided in an intermediate portion of the cathode.

6. A continuous plating apparatus for plating a planar article having opposite side faces comprising:

a plating bath compartment having at least a first wall and a second wall;

a slit provided liquid-tightly in the first wall;

a rail having a V-shaped cross-section for vertically placing the planar article thereon, wherein the rail is divided into a plurality of pieces having a suitable length, each divided rail being movable up and down with a rotatable shaft fixed thereon, and each said divided rail having a convexly curved upper edge, which contacts first with the planar article being conveyed;

a plurality of rotational rollers and a plurality of drive rollers for conveying the planar article while clamping on both side faces thereof, said plurality of rotational rollers and said plurality of drive rollers being positioned vertically and disposed on opposite sides of said rail, wherein each said divided rail is provided with at least one of said plurality of rotational rollers and said plurality of drive rollers at opposite sides thereof, an anode in the plating bath compartment;

a shield plate in the plating bath compartment;

a cylinder in operative communication with the anode;

a slit in the second wall positioned to send out the planar article, said slit being provided in the second wall liquid-tightly.

* * * * *